US009196694B2

(12) United States Patent
Bouche et al.

(10) Patent No.: US 9,196,694 B2
(45) Date of Patent: Nov. 24, 2015

(54) INTEGRATED CIRCUITS WITH DUAL SILICIDE CONTACTS AND METHODS FOR FABRICATING SAME

(71) Applicant: GLOBALFOUNDRIES, Inc., Grand Cayman (KY)

(72) Inventors: Guillaume Bouche, Albany, NY (US); Shao Ming Koh, Clifton Park, NY (US); Jeremy A. Wahl, Delmar, NY (US); Andy Wei, Queensbury, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/043,017

(22) Filed: Oct. 1, 2013

(65) Prior Publication Data

US 2015/0091093 A1    Apr. 2, 2015

(51) Int. Cl.
*H01L 21/44* (2006.01)
*H01L 29/417* (2006.01)
*H01L 27/092* (2006.01)

(52) U.S. Cl.
CPC ........ *H01L 29/41725* (2013.01); *H01L 27/092* (2013.01)

(58) Field of Classification Search
USPC .......... 438/664, 630, 640, 651, 655, 682, 199
See application file for complete search history.

(56) References Cited

U.S. PATENT DOCUMENTS 7,714,393 B2 * 5/2010 Tai et al. ........................ 257/369
2009/0280645 A1 * 11/2009 Lee et al. ...................... 438/664

* cited by examiner

*Primary Examiner* — Timor Karimy
(74) *Attorney, Agent, or Firm* — Ingrassia Fisher & Lorenz, P.C.

(57) ABSTRACT

Integrated circuits with dual silicide contacts and methods for fabricating integrated circuits with dual silicide contacts are provided. In an embodiment, a method for fabricating an integrated circuit includes providing a semiconductor substrate having PFET areas and NFET areas. The method selectively forms first silicide contacts from a first metal in the PFET areas. Further, the method selectively forms second silicide contacts from a second metal in the NFET areas. The second metal is different from the first metal.

16 Claims, 3 Drawing Sheets

INTEGRATED CIRCUITS WITH DUAL SILICIDE CONTACTS AND METHODS FOR FABRICATING SAME

TECHNICAL FIELD

The present disclosure generally relates to integrated circuits and methods for fabricating integrated circuits, and more particularly relates to integrated circuits with dual silicide contacts and methods for fabricating integrated circuits with dual silicide contacts.

BACKGROUND

The majority of present day integrated circuits are implemented by using a plurality of interconnected field effect transistors (FETs), also called metal oxide semiconductor field effect transistors (MOSFETs or MOS transistor devices). Such a transistor device includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode.

The MOS transistor device is accessed via a conductive contact typically formed on the source/drain regions between the gate electrodes of two MOS transistor devices. The conductive contact is usually formed by siliciding a metal on the source/drain regions and then depositing an insulating layer over the silicided source/drain regions and etching a contact opening in the insulating layer. A thin barrier layer, typically of titanium nitride and/or other metals and alloys, is deposited in the contact opening and the opening then is filled by a chemical vapor deposited layer of tungsten.

At reduced technology nodes, more and more circuitry is incorporated on a single integrated circuit chip and the sizes of each individual device in the circuit and the spacing between device elements decreases. However, one of the limiting factors in the continued shrinking of integrated semiconductor devices is the resistance of contacts to doped regions such as the source and drain regions. As device sizes decrease, the width of contacts decreases. As the width of the contacts decreases, the resistance of the contacts becomes increasingly larger. In turn, as the resistance of the contacts increases, the drive current of the devices decreases, thus adversely affecting device performance. Therefore, the importance of reducing contact resistance at source/drain regions is amplified at reduced technology nodes.

Accordingly, it is desirable to provide integrated circuits and methods for fabricating integrated circuits that exhibit lower contact resistance. In addition, it is desirable to provide integrated circuits and methods for fabricating integrated circuits that utilize dual silicide contacts, i.e., two different types of silicide contacts for PFET and NFET devices, to reduce contact resistance. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits with dual silicide contacts and methods for fabricating integrated circuits with dual silicide contacts are provided. In accordance with one embodiment, a method for fabricating an integrated circuit includes providing a semiconductor substrate having PFET areas and NFET areas. The method selectively forms first silicide contacts from a first metal in the PFET areas. Further, the method selectively forms second silicide contacts from a second metal in the NFET areas. The second metal is different from the first metal.

In another embodiment, a method for fabricating an integrated circuit includes providing a semiconductor substrate with a gate structure interposed between source/drain regions formed in a PFET area and a gate structure interposed between source/drain regions formed in an NFET area. The method forms a first metal layer on the source/drain regions in the PFET area. The method further includes siliciding the first metal layer to form first silicide contacts on the source/drain regions in the PFET area. Also, a second metal layer is deposited over the gate structures and source/drain regions in the NFET area. The method includes annealing the second metal layer to form second silicide contacts on the source/drain regions in the NFET area.

In accordance with another embodiment, an integrated circuit is provided and includes a semiconductor substrate and a PFET device overlying the semiconductor substrate. The PFET device includes a PFET gate structure interposed between PFET source/drain regions. First contacts are formed on the PFET source/drain regions from a first metal silicide. An NFET device overlying the semiconductor substrate is provided and includes an NFET gate structure interposed between NFET source/drain regions. Second contacts are formed on the NFET source/drain regions from a second metal silicide different from the first metal silicide.

BRIEF DESCRIPTION OF THE DRAWINGS

Embodiments of integrated circuits with dual silicide contacts and methods for fabricating integrated circuits with dual silicide contacts will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits with dual silicide contacts and methods for fabricating integrated circuits with dual silicide contacts are provided. Specifically, integrated circuits described herein are provided with two different types of silicide contacts, each of which is optimized for contacting source/drain regions in either PFET devices or NFET devices. In an exemplary embodiment, a method for fabricating an integrated circuit includes selectively forming a first metal over a PFET area of a semiconductor substrate and annealing the first metal to form first silicide contacts. Further, the exemplary method includes forming a second metal over an NFET area of the semiconductor substrate and annealing the second metal to form second silicide contacts. By optimizing the silicide contacts provided on PFET devices and NFET devices on the integrated circuit, contact resistance is lowered and device performance is improved.

FIGS. 1-14 illustrate a method for fabricating integrated circuits with dual silicide contacts in accordance with various embodiments herein. FIGS. 1-5 illustrate an embodiment for forming first silicide contacts on PFET devices, and FIGS. 6-10 illustrate an alternate embodiment for forming first silicide contacts on PFET devices. FIGS. 11-14 illustrate an embodiment for forming second silicide contacts on NFET devices. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Figure 1:
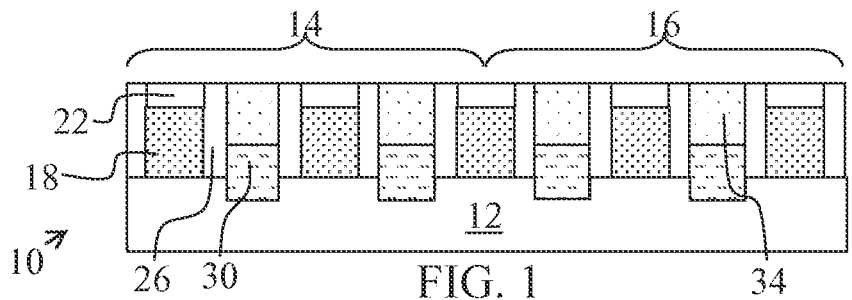
FIGS. 1-14 illustrate, in cross section, a portion of an integrated circuit and method steps for fabricating an integrated circuit in accordance with various embodiments herein.

Turning now to FIG. 1, in an exemplary embodiment, the process of fabricating an integrated circuit 10 begins by providing a semiconductor substrate 12 on which gate structures, source/drain regions, and other features may be formed. The semiconductor substrate 12 is typically a silicon wafer and includes various doping configurations as is known in the art to define P-channel field effect transistor (PFET) areas 14 and an N-channel FET (NFET) areas 16. The semiconductor substrate 12 may also include other elementary semiconductor materials such as germanium. Alternatively, the semiconductor substrate 12 may include a compound semiconductor such as, silicon carbide, gallium arsenide, indium arsenide, or indium phosphide. Further, the semiconductor substrate 12 may optionally include an epitaxial layer (epi layer), may be strained for performance enhancement, and/or may include a silicon-on-insulator (SOI) structure. Further, the semiconductor substrate 12 may be formed into fin structures for use in FinFETs. The semiconductor substrate may further encompass areas of Shallow Trench Isolation (STI) processed before the gate and which separate PFET active areas from NFET active areas. The detailed fabrication of STI well known and does not directly affect the subject matter herein.

As shown, gate structures 18 are formed overlying the semiconductor substrate 12 in both the PFET areas 14 and the NFET areas 16. Each gate structure 18 can be realized as a composite structure or stack that is formed from a plurality of different layers and materials. In this regard, the gate structures 18 can be formed by conformally depositing layers of material, using photolithographic techniques to pattern the deposited layers of material, and selectively etching the patterned layers to form the desired size and shape for the gate structures 18. For example, a relatively thin layer of dielectric material (commonly referred to as the gate insulator) can be initially deposited over the semiconductor substrate 12 using, for example, a sputtering, chemical vapor deposition (CVD) or atomic layer deposition (ALD) technique. Alternatively, this gate insulator layer could be formed by growing a dielectric material, such as silicon dioxide, on exposed silicon surfaces of the semiconductor substrate 12. In certain embodiments, a gate electrode material, such as a polycrystalline silicon material or a metal material (e.g., titanium nitride, tantalum nitride, tungsten nitride, or another metal nitride) is formed overlying the gate insulator layer. For advanced CMOS technology, gate processing is typically processed by first patterning a dummy polysilicon or amorphous silicon layer in the shape of the gate, acting as a placeholder until being further removed and replaced with a metal in a damascene way. This is referred to as the Removal Metal Gate or RMG technique Another insulating material may then be formed overlying the gate electrode material for use as a hard mask. This insulating material (such as silicon nitride) can be deposited using, for example, a sputtering or CVD technique. This insulating material can then be photolithographically patterned as desired to form a gate etch mask for etching of the gate structures 18. The underlying gate material is anisotropically etched into the desired topology that is defined by the gate etch mask. After patterning, the insulating material remains on the gate structures 18 as gate caps 22. It should be appreciated that the particular composition of the gate structures 18 and the manner in which they are formed may vary from one embodiment to another, and that the brief description of the gate stack formation is not intended to be limiting or restrictive of the recited subject matter.

In the exemplary embodiment, spacers 26 are formed around the sides of gate structures 18 and gate caps 22. The spacers 26 can be fabricated using conventional process steps such as material deposition, photolithography, and etching. In this regard, formation of the spacers 26 may begin by conformally depositing a spacer material overlying the gate caps 22, gate structures 18 and semiconductor substrate 12. The spacer material is an appropriate insulator, such as silicon nitride, and the spacer material can be deposited in a known manner by, for example, atomic layer deposition (ALD), CVD, LPCVD, semi-atmospheric chemical vapor deposition (SACVD), or PECVD. The spacer material is deposited to a thickness so that, after anisotropic etching, the spacers 26 have a thickness that is appropriate for the subsequent etching steps described below. Thereafter, the spacer material is anisotropically and selectively etched to define the spacers 26. In practice, the spacer material can be etched by, for example, reactive ion etching (RIE) using a suitable etching chemistry.

After the spacers 26 have been created, other processing may be performed to form source/drain regions 30 in PFET areas 14 and the NFET areas 16 of the semiconductor substrate 12. For example, various ion implantations may be performed on the semiconductor substrate 12 using the gate structures 18 as ion implantation masks to form desired doped source/drain regions 30 for the PFET areas 14 and NFET areas 16. Ion implantations may be sequentially performed on PFET areas 14 and NFET areas 16 by selectively masking one type of area while implanting conductivity-determining ions in the other. For example, a hard mask is deposited over the semiconductor substrate 12 and is patterned to expose the areas of the desired typed, e.g., PFET areas 14. An implantation or implantations are performed to introduce selected conductivity-determining ions into the semiconductor substrate 12 to form appropriately doped source/drain regions 30. The hard mask is removed and the process is then repeated for the areas of the other type, e.g., NFET areas 16. Annealing processes may also be performed to drive the conductivity-determining ions further into the semiconductor substrate 12. Additionally or alternatively, exposed portions of semiconductor substrate 12 in the source/drain regions 30 may be removed to form recesses and semiconductor stressors may be re-grown in the resulting recesses. In an exemplary embodiment, the semiconductor stressors in PFET areas 14 may comprise silicon germanium (SiGe) and the semiconductor stressors in NFET areas 16 may comprise silicon.

The manufacturing process may proceed by forming a dielectric material 34 overlying the gate structures 18, gate caps 22 and spacers 26, and source/drain regions 30. The dielectric material 34 may be formed by CVD, spin-on, sputtering, or other suitable methods. The dielectric material 34 may include silicon oxide, silicon oxynitride, or a suitable low-k material. In the exemplary embodiment, the dielectric material 34 is planarized to the height of the gate caps 22, such as by chemical mechanical planarization (CMP). At this point in the fabrication process, previously unoccupied space around the spacers 26 has been completely filled with the dielectric material 34. For an RMG process, the sacrificial or dummy gate material is removed, high permitivity gate oxide processed, and metal gate deposited.

Figure 2:
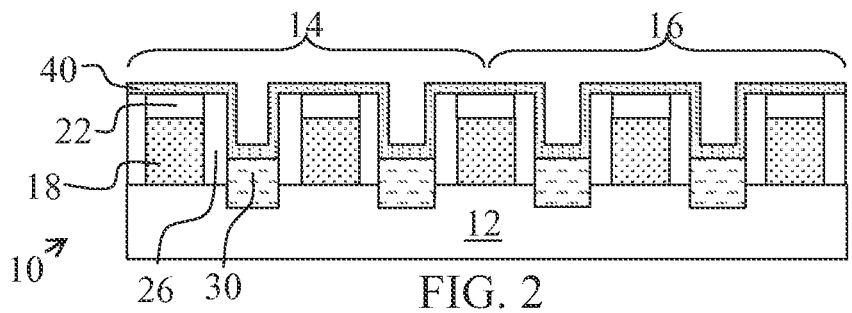

After the dielectric material 34 has been deposited, the process may continue in FIG. 2 by selectively removing dielectric material 34 overlying the PFET areas 14 and NFET areas 16 (the dielectric material 34 may remain covering other features or regions on the semiconductor substrate 12 unrelated to the current process). In an exemplary embodiment, the dielectric material 34 is removed by patterning a photoresist film over the dielectric material and performing a reactive ion etch (RIE) to remove the exposed dielectric material 34.

A first metal layer 40 is then deposited overlying the gate structures 18, gate caps 22 and spacers 26, and source drain regions 30 in both the PFET areas 14 and NFET areas 16. The first metal layer 40 is a metal that will be used to form silicide contacts in the PFET areas 14. Further, the silicide contacts in the PFET areas 14 must be able to withstand the NFET silicide contacts anneal later in the process. An exemplary first metal layer 40 is platinum. Alternatively, the first metal layer 40 may include nickel, other metals suitable for P-type contacts, or alloys of platinum, nickel, and/or the other suitable metals for P-type contacts. The first metal layer 40 may be conformally deposited by blanket physical vapor deposition (PVD) or another suitable method. An exemplary first metal layer 40 is deposited to a thickness of about 3 nanometers (nm) to about 15 nm.

Figure 3:
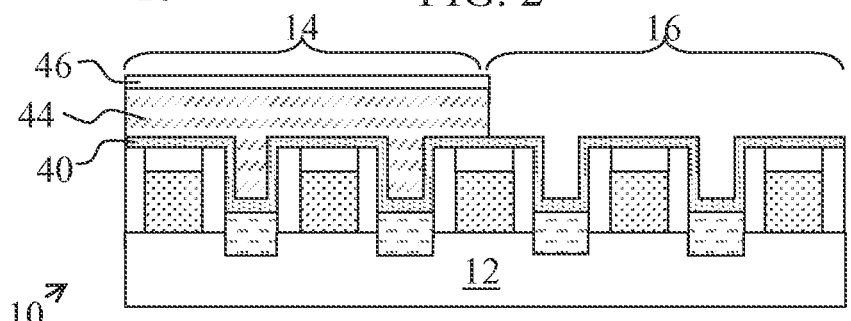

FIG. 3 illustrates further processing of the partially fabricated integrated circuit 10. As noted above, the first metal layer 40 is selected to form contacts in the PFET areas 14 and is formed from metal optimized for PFET contacts. In order to prevent the formation of silicide contacts in the NFET areas 16 from the first metal layer 40, the first metal layer 40 is selectively removed from the NFET areas 16. For this reason, a mask layer 44 is deposited over the first metal layer 40. An exemplary mask layer 44 is formed from spin on carbon (SOC), an organic planarizing layer (OPL), or a deep ultra violet light absorbing oxide (DUO) material; however, any suitable material that may be patterned, selectively etched relative to the first metal layer 40, and easily removed from the partially fabricated integrated circuit 10 may be used. A photoresist film 46 may be formed over the mask layer 44 and patterned to expose the portions of the mask layer 44 overlying the NFET areas 16. Thereafter, the portions of the mask layer 44 overlying the NFET areas 16 are etched, such as by a RIE process, to expose the first metal layer 40 in the NFET areas 16.

Figure 4:
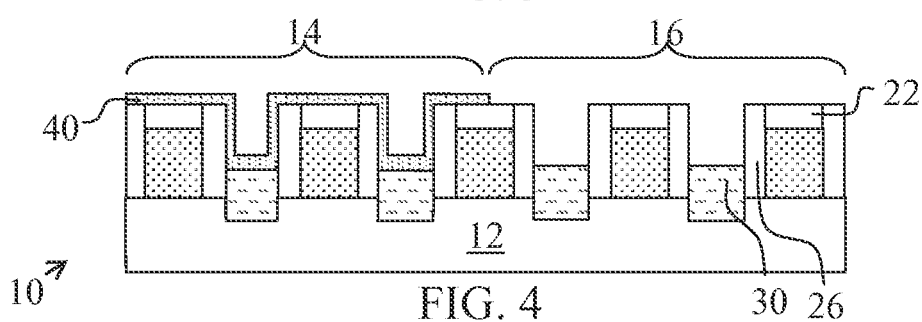

The exposed first metal layer 40 in the NFET areas 16 is removed in FIG. 4. Specifically, an etch such as an aqua regia (nitro-hydrochloric acid) wet etch may selectively remove the first metal layer 40. Other suitable etching process may be used provided they do not etch, or only slightly etch, gate caps 22, spacers 26, and source/drain regions 30. In FIG. 4, the remaining photoresist film 46 and mask layer 44 are removed, such as by a reactive ion etch, for example an $O_2$ plasma etch.

Figure 5:
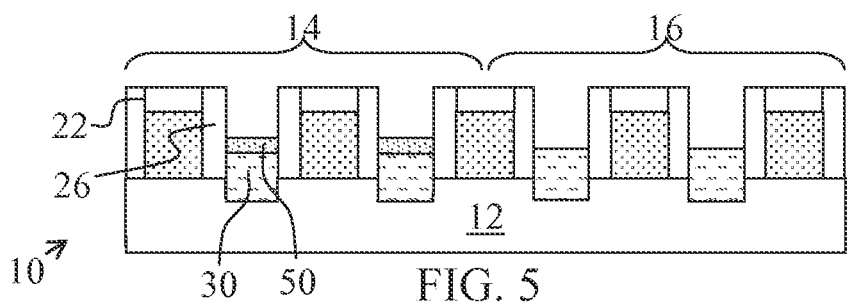

In FIG. 5, the process may continue by forming first silicide contacts 50 on the source/drain regions 30 in the PFET areas 14. Specifically, a low temperature anneal at a temperature of about 100° C. to about 450° C. is performed. Under this heat treatment, the first metal layer 40 reacts preferentially with the semiconductor material of the source/drain regions 30 in the PFET areas 14 to form first silicide contacts 50. The first metal layer 40 does not react with the dielectric material of the gate caps 22 and spacers 26. The unreacted first metal layer 40 is then selectively etched with an acidic solution from the gate caps 22 and spacers 26 such that only the first silicide contacts 50 remain. The structure of the partially fabricated integrated circuit 10 of FIG. 5 is then ready for formation of second contacts in the NFET areas 16. The process for forming second contacts in the NFET areas 16 is illustrated in FIGS. 11-14.

Figure 6:
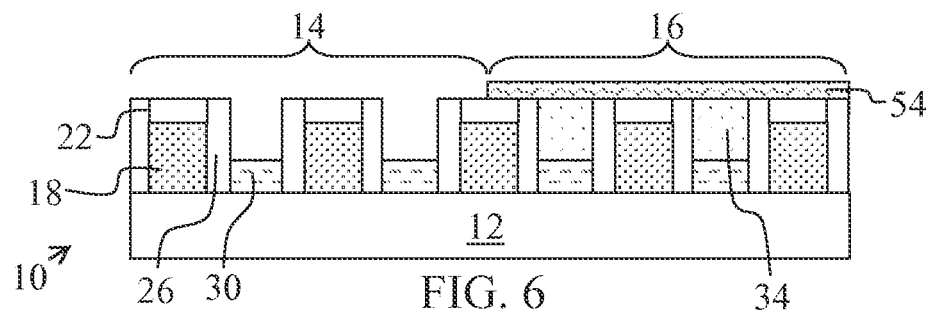

Before describing the process for forming second contacts in the NFET areas 16, an alternate embodiment for forming first silicide contacts in the PFET areas 14 is described in FIGS. 6-10. With cross-reference to FIG. 1, FIG. 6 illustrates the selective removal of dielectric material 34 overlying the PFET areas 14. The dielectric material 34 remains covering the NFET areas 16. In an exemplary embodiment, the dielectric material 34 is removed by patterning a photoresist film 54 over the dielectric material 34 and performing a reactive ion etch (RIE) to remove the exposed dielectric material 34 overlying the source/drain regions 30 in the PFET areas 14.

Figure 7:
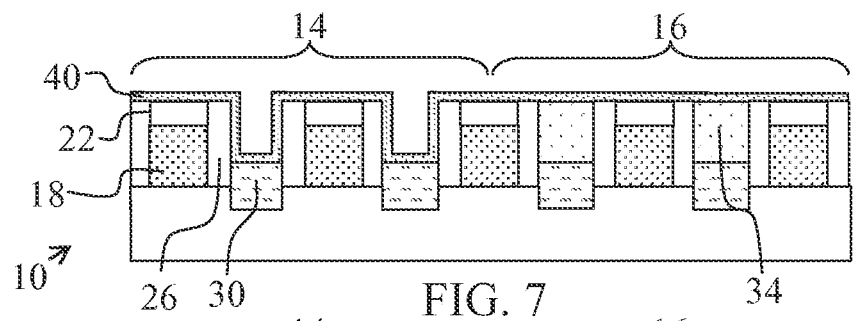

In FIG. 7, the photoresist film 54 is removed and a first metal layer 40 is formed over the partially fabricated integrated circuit 10. As shown, the exemplary first metal layer 40 is conformally deposited over the gate caps 22, spacers 26, and source/drain regions 30 in the PFET areas 14. Further, the exemplary first metal layer 40 is deposited over the gate caps 22 and dielectric material 34 in the NFET areas 16. As indicated above, the first metal layer 40 is a metal that will be used to form silicide contacts in the PFET areas 14. Further, the silicide contacts in the PFET areas 14 must be able to withstand the NFET silicide contacts anneal later in the process. An exemplary first metal layer 40 is platinum. Alternatively, the first metal layer 40 may include nickel, other metals suitable for P-type contacts, or alloys of platinum, nickel, and/or the other suitable metals for P-type contacts. The first metal layer 40 may be conformally deposited by blanket physical vapor deposition (PVD) or another suitable method. An exemplary first metal layer 40 is deposited to a thickness of about 3 nm to about 15 nm.

Figure 8:
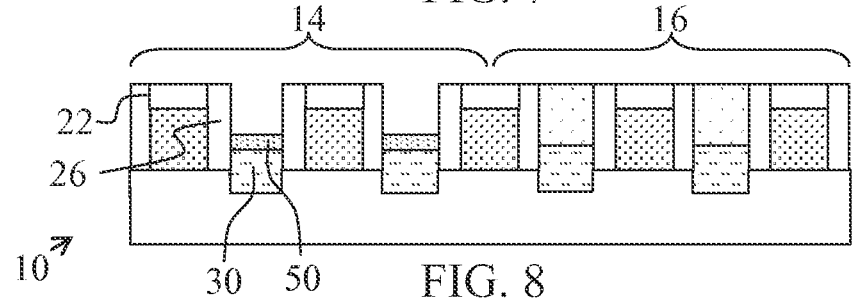

The process continues in FIG. 8 by forming first silicide contacts 50 on the source/drain regions 30 in the PFET areas 14. Specifically, a low temperature anneal at a temperature of about 100° C. to about 450° C. is performed. Under this heat treatment, the first metal layer 40 reacts preferentially with the semiconductor material of the source/drain regions 30 in the PFET areas 14 to form first silicide contacts 50. The first metal layer 40 does not react with the gate caps 22, spacers 26, and dielectric material 34. The unreacted first metal layer 40 is then selectively etched with an acidic solution from the gate caps 22, spacers 26, and dielectric material 34 such that only the first silicide contacts 50 remain.

Figure 9:
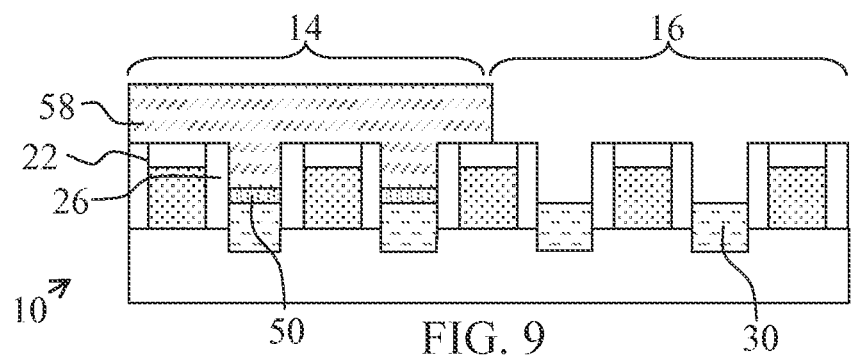

In FIG. 9, mask layer 58 is formed over the PFET areas 14. Specifically, the mask layer 58 is deposited over the partially fabricated integrated circuit 10 and is patterned to expose the NFET areas 16. The mask layer 58 may be any material that can withstand selective etching of the dielectric material 34 in the NFET areas 16 and can be easily removed from the gate caps 22, spacers 26 and first silicide contacts 50 in the PFET areas 14. For example, the mask layer 58 can be a photoresist. After forming the mask layer 58 over the PFET areas 14, the dielectric material 34 is etched from the NFET areas 16, such as by performing an RIE process. The etch exposes the source/drain regions 30 in the NFET areas 16 as shown in FIG. 9. Alternatively, the dielectric material 34 can be etched without protecting the PFET area with mask layer 58 if the etch chemistry is selective to remove the dielectric relative to the first silicide contacts 50. For example, dilute HF may not require masking of the PFET area.

Figure 10:
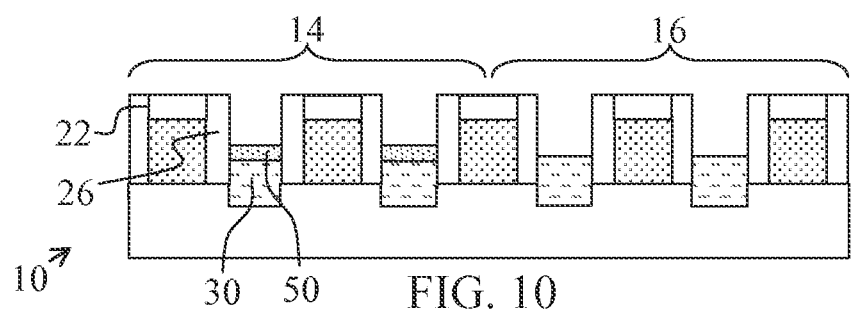

The mask layer 58 is then removed from the PFET areas 14 as shown in FIG. 10. Thus, the partially fabricated integrated circuit 10 is provided with the same structure as the partially fabricated integrated circuit of FIG. 5. Specifically, first silicide contacts 50 are formed on the source/drain regions 30 in the PFET areas 14, and the partially fabricated integrated circuit 10 is ready for further processing to form second silicide contacts in NFET areas 16.

Figure 11:
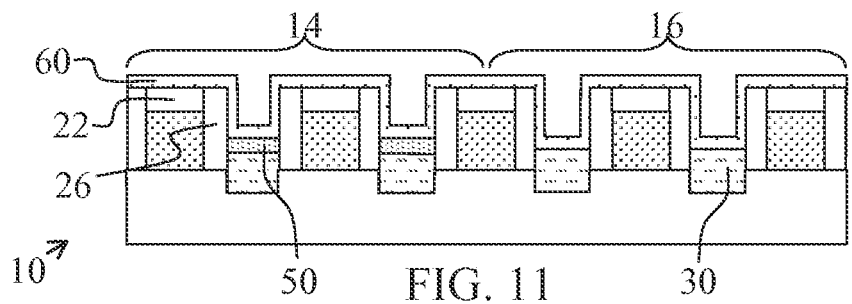

The process for forming second silicide contacts on the source/drain regions 30 in the NFET areas 16 begins in FIG. 11. As shown, a second metal layer 60 is formed over the PFET areas 14 and NFET areas 16. Specifically, the exemplary second metal layer 60 is conformally deposited over the gate caps 22 and spacers 26, over the first silicide contacts 50 in the PFET areas 14, and over the source/drain regions 30 in the NFET areas 16. The second metal layer 60 includes a metal that will be used to form silicide contacts in the NFET areas 16 and will remain overlying the first silicide contacts 50 in the PFET areas 14. An exemplary second metal layer 60 includes titanium. Alternatively, the second metal layer 60 may include cobalt or other metals or alloys suitable for N-type contacts. The second metal layer 60 further includes a capping material for capping the silicide contacts in the PFET areas 14 and NFET areas 16. For example, the second metal layer 60 may include a titanium nitride capping material. The second metal layer 60 may be conformally deposited by blanket physical vapor deposition (PVD) or another suitable method. An exemplary second metal layer 60 is deposited to a thickness of about 5 nm to about 20 nm, for example an exemplary second metal layer 60 may include about 3 nm to about 15 nm titanium and about 2 nm to about 5 nm titanium nitride.

Figure 12:
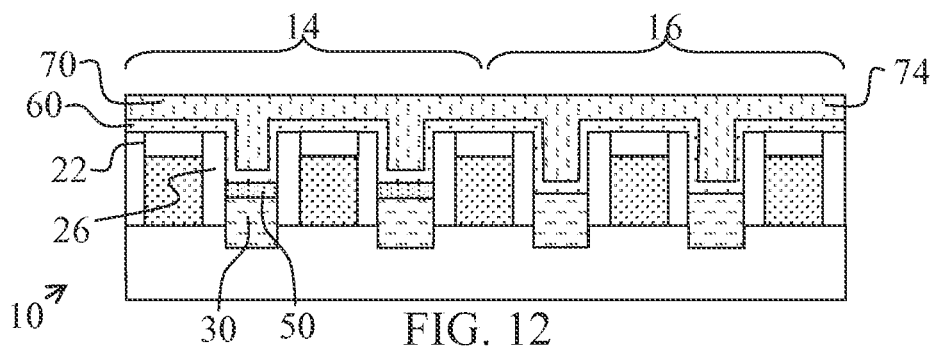

As shown in FIG. 12, after formation of the second metal layer 60 over the PFET areas 14 and NFET areas 16, a fill metal 70 is deposited over the partially fabricated integrated circuit 10. An exemplary fill metal 70 is tungsten, though copper or any other suitable conductive metal that is easy to deposit and polish may be used. The fill metal 70 may be conformally deposited such as by CVD. As shown, the fill metal 70 forms an overburden portion 74 located above the second metal layer 60 formed on the gate caps 22.

Figure 13:
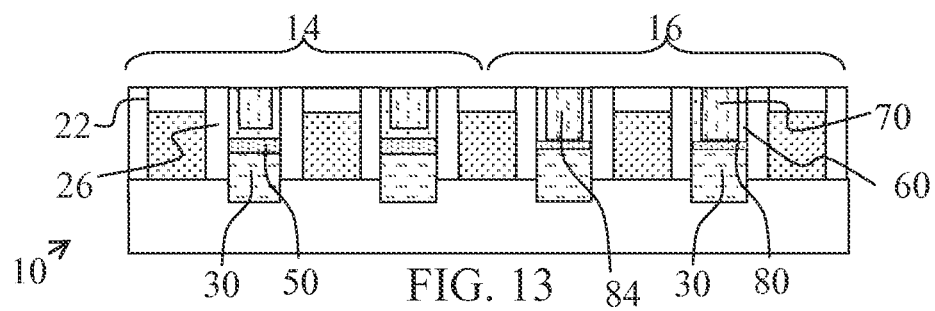

In FIG. 13, the second metal layer 60 overlying the gate caps 22 and the overburden portion 74 of the fill metal 70 are removed, such as by a planarization process. Further, second silicide contacts 80 are formed on the source/drain regions 30 in the NFET areas 16. For example, an anneal may be performed, such as at a temperature of from about 600° C. to about 850° C. Under this heat treatment, the metal in the second metal layer 60 reacts preferentially with the semiconductor material of the source/drain regions 30 in the NFET areas 16 to form second silicide contacts 80. The second metal layer 60 does not react with the gate caps 22, spacers 26, or first silicide contacts 50. Further, it is noted that in the silicidation reaction of titanium with silicon, silicon is the migrating species. Therefore, a titanium second silicide anneal does not degrade the first silicide contacts 50 in the PFET areas 14. Further, it is noted that while the fill metal 70 is deposited and planarized before the second silicide contacts 80 are formed in the illustrated embodiment, it is contemplated that the second silicide anneal be performed at any time after deposition of the second metal layer 60, such as before the fill metal deposition or before planarization.

The partially fabricated integrated circuit 10 of FIG. 13 is thus formed with contact structures 84 in the PFET areas 14 and NFET areas 16. Structurally, the contact structures 84 in the PFET areas 14 include first silicide contacts 50, second metal layer 60, and fill metal 70. The contact structures 84 in the NFET areas 16 include second silicide contacts 80, non-reacted portions of the second metal layer 60, and fill metal 70.

Figure 14:
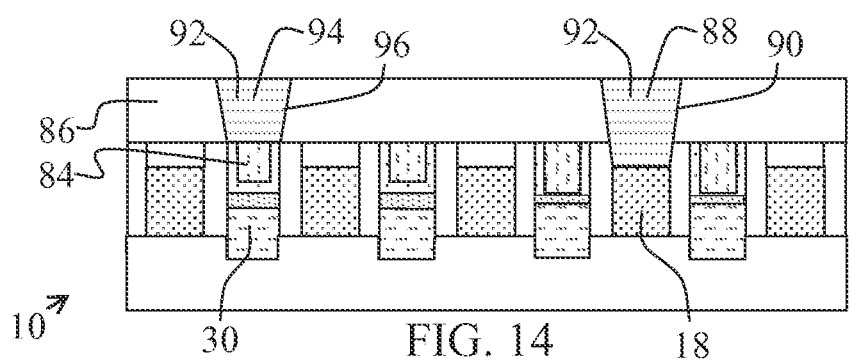

FIG. 14 illustrates further processing including the formation of an interconnect structure to provide electrical communication to the contact structures 84. As shown, an interlayer dielectric material 86 is deposited over the partially fabricated integrated circuit 10. Then, a gate interconnect 88 may be formed by selectively etching a trench or trenches 90 over a selected gate structure or gate structures 18. An interconnect metal 92 is then deposited to form the gate interconnect 88. Likewise, a source/drain interconnect 94 may be formed by selectively etching a trench or trenches 96 over a selected source/drain region or regions 30. Interconnect metal 92 is then deposited to form the source/drain interconnect 94.

As described herein, an integrated circuit fabrication process is implemented to form improved contacts to source/drain regions. Specifically, dual silicide contacts are formed, with first silicide contacts formed from a first metal optimized for PFET contacts and second silicide contacts formed from a second metal optimized for NFET contacts. Thus, contact resistance in both PFET and NFET areas are reduced and PFET and NFET device performance is optimized.

To briefly summarize, the fabrication methods described herein result in integrated circuits having source/drain contacts with improved performance. While at least one exemplary embodiment has been presented in the foregoing detailed description, it should be appreciated that a vast number of variations exist. Further, any refinement pertaining to the fabrication of Shallow Trench Isolation, or related to the inclusion or not on the semiconductor substrate of a Contact Etch Stop Layer (CESL) over source/drain regions, or related to the typical clean steps included prior to metal deposition in view of forming a good quality silicide has been omitted for the sake of clarity. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate having PFET areas and NFET areas;
   selectively forming first silicide contacts from a first metal in the PFET areas;
   depositing a second metal on the first silicide contacts in the PFET areas and on the semiconductor substrate in the NFET areas, wherein the second metal is different from the first metal; and
   forming second silicide contacts from the second metal in the NFET areas, wherein selectively forming first silicide contacts from the first metal in the PFET areas comprises:
      selectively forming the first metal overlying the semiconductor substrate in the PFET areas;
      annealing the first metal overlying the semiconductor substrate in the PFET areas to form the first silicide contacts;

etching a dielectric material overlying the PFET areas and the NFET areas to expose the PFET areas and the NFET areas;
depositing the first metal on the semiconductor substrate in the PFET areas and the NFET areas; and
removing the first metal from the semiconductor substrate in the NFET areas before annealing the first metal overlying the semiconductor substrate in the PFET areas;
or selectively forming first silicide contacts from the first metal in the PFET areas comprises:
etching a dielectric material overlying the PFET areas, wherein the dielectric material remains overlying the NFET areas;
depositing the first metal on the semiconductor substrate in the PFET areas and over the dielectric material overlying the NFET areas;
annealing the first metal overlying the semiconductor substrate in the PFET areas; and
etching the dielectric material overlying the NFET areas after annealing the first metal overlying the semiconductor substrate in the PFET areas.

2. The method of claim 1 wherein depositing a second metal on the first silicide contacts in the PFET areas and on the semiconductor substrate in the NFET areas comprises depositing the second metal over the semiconductor substrate in the PFET areas and the NFET areas, wherein the first silicide contacts form a barrier between the second metal and the semiconductor substrate in the PFET areas; and
wherein forming second silicide contacts from the second metal in the NFET areas comprises annealing the second metal to form the second silicide contacts in the NFET areas.

3. The method of claim 1 further comprising:
depositing a metal fill material on the second metal layer in the PFET area and on the second silicide contact in the NFET area;
defining first contact structures over the PFET areas from the metal fill material on the second metal layer on the first silicide contacts; and
defining second contact structures over the NFET areas from the metal fill material on the second silicide contacts.

4. A method for fabricating an integrated circuit, the method comprising:
providing a semiconductor substrate with a gate structure interposed between source/drain regions formed in a PFET area and a gate structure interposed between source/drain regions formed in an NFET area;
forming a first metal layer on the source/drain regions in the PFET area;
siliciding the first metal layer to form first silicide contacts on the source/drain regions in the PFET area;
depositing a second metal layer over the gate structure and source/drain regions in the NFET area and in the PFET area;
annealing the second metal layer to form second silicide contacts on the source/drain regions in the NFET area; and
depositing a metal fill material overlying the second metal layer in the PFET area and overlying the second metal layer and second silicide contact in the NFET area.

5. The method of claim 4 wherein a dielectric material overlies the semiconductor substrate, and wherein forming a first metal layer on the source/drain regions in the PFET area comprises:

etching the dielectric material to expose the gate structure and the source/drain regions in the PFET area and the gate structure and the source/drain regions in the NFET area; and
depositing the first metal layer over the gate structure and the source/drain regions in the PFET area and the gate structure and the source/drain regions in the NFET area.

6. The method of claim 5 wherein forming a first metal layer on the source/drain regions in the PFET area further comprises:
forming a mask over the gate structure and the source/drain regions in the PFET area; and
etching the first metal layer overlying the gate structure and the source/drain regions in the NFET area.

7. The method of claim 6 further comprising removing non-silicided portions of the first metal layer from the PFET area after siliciding the first metal layer to form the first silicide contacts.

8. The method of claim 4 wherein a dielectric material overlies the semiconductor substrate, and wherein forming a first metal layer on the source/drain regions in the PFET area comprises:
etching the dielectric material to expose the gate structure and the source/drain regions in the PFET area; and
depositing the first metal layer over the gate structure and the source/drain regions in the PFET area and over the dielectric material overlying the NFET area.

9. The method of claim 8 further comprising removing non-silicided portions of the first metal layer from the PFET area and the NFET area after siliciding the first metal layer to form first silicide contacts.

10. The method of claim 9 further comprising selectively etching, relative to the first silicide contacts, the dielectric material overlying the gate structure and the source/drain regions in the NFET area before depositing the second metal layer over the gate structure and source/drain regions in the NFET area and in the PFET area.

11. The method of claim 9 further comprising:
forming a mask over the gate structure and the source/drain regions in the PFET area; and
etching the dielectric material overlying the gate structure and the source/drain regions in the NFET area before depositing the second metal layer over the gate structure and source/drain regions in the NFET area and in the PFET area.

12. The method of claim 4 wherein:
forming a first metal layer on the source/drain regions in the PFET area comprises depositing platinum on the source/drain regions in the PFET area; and
depositing a second metal layer over the gate structure and source/drain regions in the NFET area and in the PFET area comprises depositing titanium and titanium nitride over the gate structure and source/drain regions in the NFET area and in the PFET area.

13. The method of claim 4 wherein depositing a metal fill material overlying the second metal layer in the PFET area and the second metal layer and second silicide contact in the NFET area comprises depositing the metal fill material on the second metal layer in the PFET area and depositing the metal fill material on the second metal layer and on the second silicide contact in the NFET area.

14. The method of claim 13 further comprising:
performing a planarization process to remove the second metal layer and the metal fill material overlying the gate structures and to define a contact structure over each source/drain region;

depositing a dielectric material overlying the contact structures and gate structures;

forming an electrical gate contact to a selected gate structure; and forming an electrical source/drain contact to a selected contact structure.

15. The method of claim 4 further comprising:

defining first contact structures over the source/drain regions in the PFET area from the metal fill material overlying the second metal layer overlying the first silicide contacts; and defining second contact structures over the source/drain regions in the NFET area from the metal fill material overlying the second metal layer overlying the second silicide contacts.

16. A method for fabricating an integrated circuit, the method comprising:

providing a semiconductor substrate having PFET areas and NFET areas;

etching a dielectric material overlying the PFET areas and the NFET areas to expose the PFET areas and the NFET areas;

depositing a first metal over the semiconductor substrate in the PFET areas and the NFET areas;

removing the first metal from the NFET areas;

after removing the first metal from the NFET areas, annealing the first metal over the semiconductor substrate in the PFET areas to form first silicide contacts; and selectively forming second silicide contacts from a second metal in the NFET areas, wherein the second metal is different from the first metal.

* * * * *